United States Patent
Yu

(10) Patent No.: US 7,538,703 B2
(45) Date of Patent: May 26, 2009

(54) SIGMA-DELTA MODULATION WITH MINIMIZED NOISE AND FRACTIONAL-N PHASE-LOCKED LOOP INCLUDING THE SAME

(75) Inventor: Hwa-Yeal Yu, Bucheon-Si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 121 days.

(21) Appl. No.: 11/703,260

(22) Filed: Feb. 7, 2007

(65) Prior Publication Data

US 2007/0182611 A1    Aug. 9, 2007

(30) Foreign Application Priority Data

Feb. 7, 2006    (KR) .............. 10-2006-0011535

(51) Int. Cl.
*H03M 1/20*    (2006.01)
(52) U.S. Cl. .................. 341/143; 341/155; 341/144
(58) Field of Classification Search ............... 341/131, 341/155, 143; 327/115, 117, 157; 331/23
See application file for complete search history.

(56) References Cited

U.S. PATENT DOCUMENTS

| | | | | |
|---|---|---|---|---|
| 6,788,232 B1 * | 9/2004 | Lee | ............. | 341/143 |
| 6,816,096 B2 * | 11/2004 | Comer et al. | ............... | 341/131 |
| 7,215,270 B1 * | 5/2007 | Kozak et al. | ................ | 341/143 |
| 2005/0068213 A1 * | 3/2005 | Fontaine et al. | ............. | 341/143 |
| 2005/0156771 A1 * | 7/2005 | Melanson | .................... | 341/143 |
| 2005/0156772 A1 * | 7/2005 | Melanson | .................... | 341/143 |
| 2006/0181446 A1 * | 8/2006 | Yu | ............................. | 341/143 |

OTHER PUBLICATIONS

Korean Patent Application No. 1019940020531 to Shin, having Publication date of May 17, 1997 (w/ English Abstract page).
Korean Patent Application No. 1996-048686 to Park et al., having Publication date of Jul. 25, 1998 (w/ English Abstract page).
Korean Patent Application No. 1019990008757 to Kim et al., having Publication date of Oct. 16, 2000 (w/ English Abstract page).
Korean Patent Application No. 1020030000354 to Lee, having Publication date of Jul. 9, 2004 (w/ English Abstract page).
Korean Patent Application No. 10-2003-7003917 to Bazarjani, having Publication date of Jun. 9, 2003 (w/ English Abstract page).

* cited by examiner

*Primary Examiner*—Vibol Tan
(74) *Attorney, Agent, or Firm*—Monica H. Choi

(57) ABSTRACT

A sigma-delta modulator (SDM) includes a delay circuit and an operation circuit. The delay circuit generates multiple clock signals with different delays. The operation circuit includes a plurality of operation stages that operate with timing according to all of the clock signals for high-order sigma-delta modulation. Thus, noise may be dispersed for minimizing noise coupling. The SDM is used to particular advantage within a fractional-N phase-locked loop.

20 Claims, 6 Drawing Sheets

SIGMA-DELTA MODULATION WITH MINIMIZED NOISE AND FRACTIONAL-N PHASE-LOCKED LOOP INCLUDING THE SAME

BACKGROUND OF THE INVENTION

This application claims priority under 35 USC § 119 to Korean Patent Application No. 2006-11535, filed on Feb. 7, 2006 in the Korean Intellectual Property Office, the disclosure of which is incorporated herein in its entirety by reference.

1. Field of the Invention

The present invention relates generally to sigma delta modulation, and more particularly to high-order sigma-delta modulation that operates with multiple clock signals having different delays for reduced noise, and a fractional-N phase locked loop (PLL) including the same.

2. Background of the Invention

Generally, a phase-locked loop (PLL) receives a reference frequency signal having a relatively low frequency and generates an output frequency signal having a relatively high frequency. The PLL may be referred to as a frequency synthesizer in the wireless communication field.

A divider is used in the PLL for generating a division frequency signal obtained by frequency division of the output frequency signal. The divider may operate either in an integer-N mode with the frequency being divided by an integer or in a fractional-N mode with the frequency being divided by a sum of an integer and a fraction. The fractional-N mode is more advantageous than the integer-N mode in view of in-band noise, lock time, and/or reference spurious noise.

According to the fractional-N mode, a division ratio is continuously adjusted such that a desired average fractional division ratio is obtained. Particularly, by using a sigma-delta modulator (SDM) in the fractional-N mode, a spurious tone resulting from adjusting the division ratio may be randomized. In addition, the fractional spurious tone may be reduced in an operation band, and noise may be moved to a high frequency out of the operation band based on a noise-shaping characteristic of the SDM. However, the reduction of in-band noise is limited due to nonlinear noise generated from the SDM.

FIG. 1 shows a block diagram of a conventional fractional-N PLL. Referring to FIG. 1, the PLL 10 includes a reference counter (R counter) 11, a phase-frequency detector (PFD) 12, a charge pump (CP) 13, a loop filter 14, a voltage-controlled oscillator (VCO) 15, a division counter (N counter) 16, and an SDM (sigma-delta modulator) 17.

The R counter 11 generates a reference frequency signal Fref from frequency division of a received frequency signal Ftxco. The PFD 12 determines a phase difference between the reference frequency signal Fref and a division frequency signal Fcnt from the N counter 16.

The CP 13 operates based on output signals of the PFD 12 to generate a control signal. The VCO 15 generates an output signal Fpll of the PLL 10 from such a control signal. The N counter 16 performs frequency division on the output signal Fpll by the number N to provide the division frequency signal Fcnt.

The division frequency signal Fcnt is input by the PFD 12, and is also provided to the SDM 17 as a clock signal SDM_CLK. Thus, the PFD 12, the CP 13, and the SDM 17 operate in synchronization with the same clock signal. In the PFD 12 and the CP 13, a considerable amount of high-frequency switching noise may be generated and much digital noise may be generated in the SDM 17. When noises are generated concurrently in many noise sources, noise coupling may amplify such noise.

FIG. 2 is a timing diagram illustrating noise coupling in the PLL of FIG. 1. Referring to FIG. 2, when the PLL 10 is locked, the reference frequency signal Fref and the division frequency signal Fcnt have substantially the same phase. Thus, the PFD 12 and the SDM 17 operate concurrently such that noise PFD/CP_NOISE generated in the PFD 12 and the CP 13 and noise SDM_NOISE generated in the SDM 17 may occur concurrently to be coupled.

The SDM 17 and the CP 13 may be operated at different edges of a clock signal to prevent noise coupling. However, noise of each such component cannot be reduced even if noise coupling is prevented. Also, in case of an application having a PLL, for example a transmitting part of a device adopting code division multiple access (CDMA), performance is seriously degraded by in-band noise around an output frequency band. Therefore, reducing noise in the SDM by preventing noise coupling is desired.

SUMMARY OF THE INVENTION

Accordingly, a sigma-delta modulator according to embodiments of the present invention uses multiple clock signals with different delays to prevent noise coupling.

A sigma-delta modulator (SDM) according to an aspect of the present invention includes a delay circuit and an operation circuit. The delay circuit generates a plurality of clock signals, each clock signal having a respective unique delay from a reference clock signal. The operation circuit includes a plurality of operation stages that operate with timing according to all of the clock signals for high-order sigma-delta modulation.

In one embodiment of the present invention, the operation stages include a plurality of first-order sigma-delta modulators coupled in series. Each of the first-order sigma-delta modulators includes a respective accumulator timed with a respective unique one of the clock signals.

In an example embodiment of the present invention, the respective clock signal for a first-order sigma-delta modulator disposed more toward an output of the SDM has less delay. For example, the respective clock signal for a last first-order sigma-delta modulator is the reference clock signal without any delay.

In another embodiment of the present invention, the SDM further includes a latch and a quantizer. The latch is coupled to a last first-order sigma-delta modulator, and the latch operates according to one of the clock signals having a maximum delay. The quantizer quantizes an output of the latch to generate a quantized output that is fed-back to each of the first-order sigma-delta modulators.

In an example embodiment of the present invention, the first-order sigma-delta modulators are each configured with an interpolative architecture.

In a further example embodiment of the present invention, the maximum delay of the respective delays is smaller than a period of the reference clock signal.

In another embodiment of the present invention, the SDM may be used to particular advantage in a fractional-N phase-locked loop (PLL) including a phase-frequency detector (PFD) and a voltage-controlled oscillator (VCO). The PFD determines a phase difference between a reference frequency signal and a division frequency signal obtained by frequency division of an output frequency signal of the PLL by a division ratio. The VCO generates the output frequency signal depending on such phase difference. The SDM generates the division ratio from a fractional input and with the division frequency signal being the reference clock signal.

In this manner, the operation stages of the SDM are timed according to the multiple clock signals having different delays. Thus, noise is dispersed in such operation stages to different time points for minimizing noise coupling in the SDM and in turn the PLL.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6, and 7 refer to elements having similar structure and/or function.

DETAILED DESCRIPTION OF THE INVENTION

Figure 1:
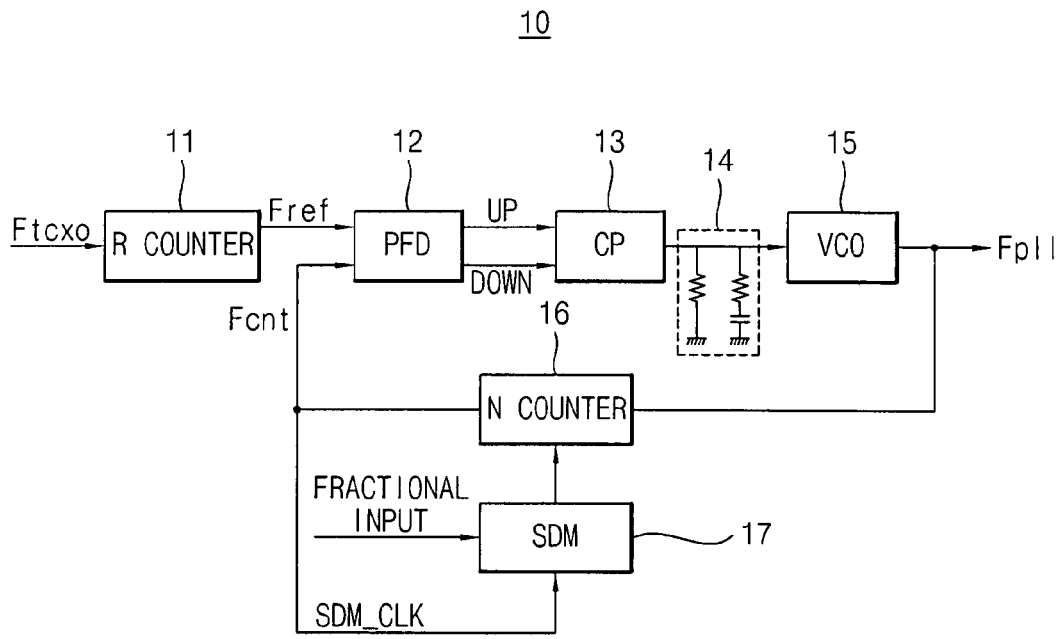
FIG. 1 is a block diagram of a conventional fractional-N phase-locked loop (PLL)
Figure 2:
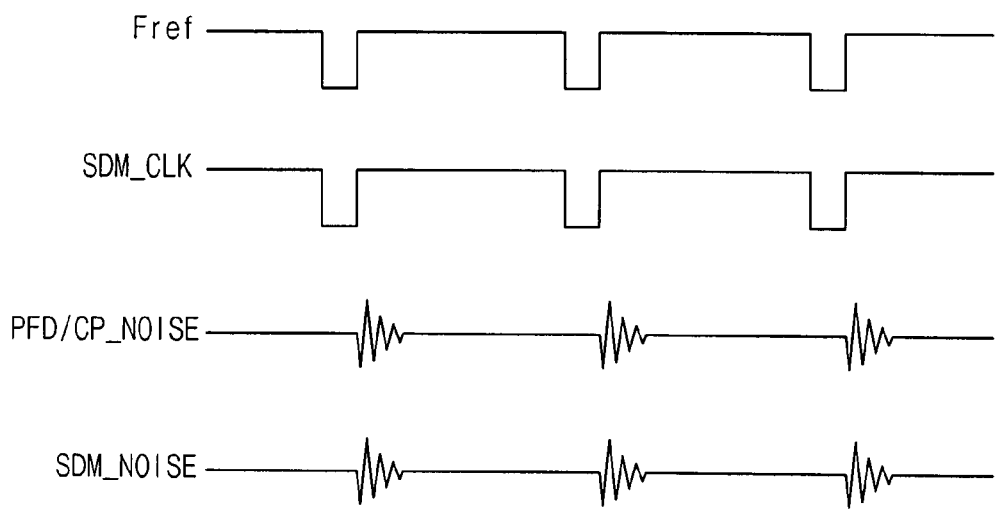
FIG. 2 is a timing diagram illustrating noise coupling in the PLL of FIG. 1, according to the prior art.

Embodiments of the present invention are now described more fully with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A high-order sigma-delta modulator (SDM) may be implemented with a multistage noise shaping (MASH) architecture or an interpolative architecture, as known to one of ordinary skill in the art. Both the MASH and interpolative architectures include large numbers of accumulators, that is, integrators. The accumulators process 10-bit to 30-bit data according to a resolution of an input value. Thus, when the accumulators operate according to one clock signal, much noise may be generated.

Figure 3:
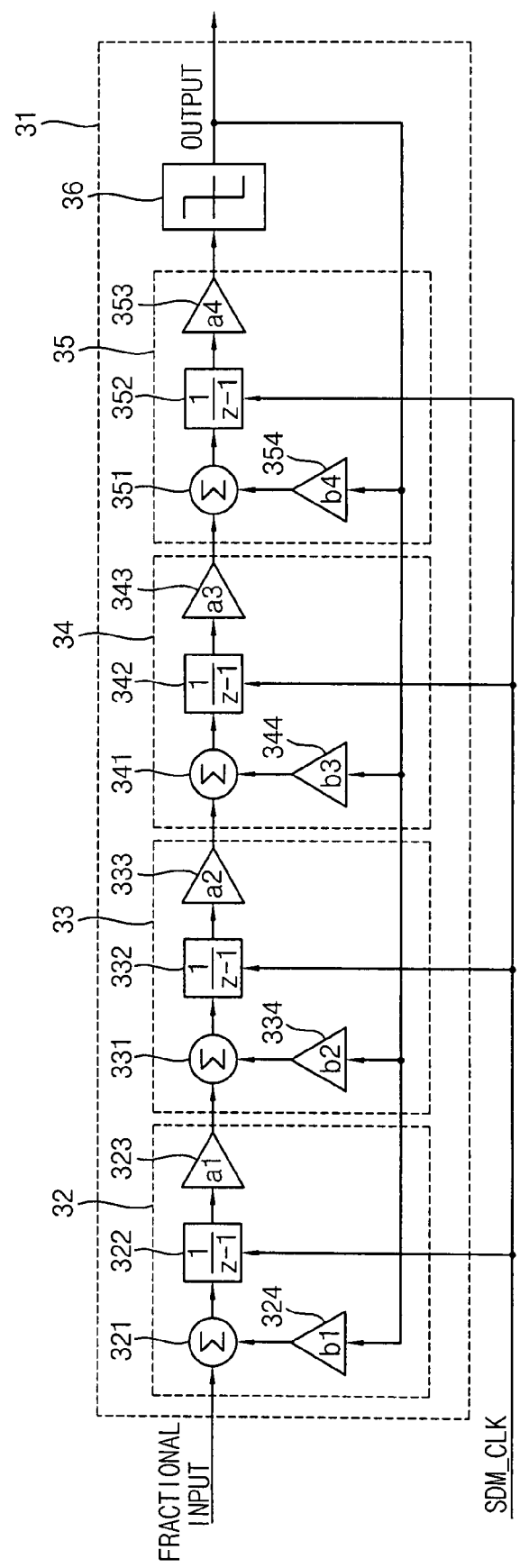
FIG. 3 is a block diagram of a fourth-order sigma-delta modulator (SDM) of an interpolative architecture.

FIG. 3 is a block diagram of a fourth-order SDM having an interpolative architecture. Referring to FIG. 3, the fourth-order SDM 30 includes an operation circuit 31 including first, second, third, and fourth operation stages, 32, 33, 34, and 35, respectively, and a 1-bit quantizer 36.

Each of the first, second, third, and fourth operation stages 32, 33, 34, and 35 is a respective first-order sigma-delta modulator. Thus, the first, second, third, and fourth operation stages 32, 33, 34, and 35 include adders 321, 3331, 341, and 351, respectively, accumulators 322, 332, 342, and 352, respectively, first multipliers 323, 333, 343, and 353, respectively, and second multipliers 324, 334, 344, and 354, respectively.

Each of the first, second, third, and fourth operation stages 32, 33, 34, and 35 has the respective adder, the respective accumulator, the respective first multiplier, and the respective second multiplier configured as the respective first-order sigma-delta modulator, as illustrated in FIG. 3. Each of the stages 32, 33, 34, and 35 performs a respective z-transform and provides a respective transfer function.

The operation stages 32, 33, 34, and 35 are connected in series with the first operation stage 32 furthest from an output of the SDM 30 receiving a fractional input. The output of the first operation stage 32 is input to the second operation stage 33. The output of the second operation stage 33 is input to the third operation stage 34. The output of the third operation stage 34 is input to the fourth operation stage 35. The output of the fourth operation stage 35 is quantized by a 1-bit quantizer 36 that generates the output of the SDM 30.

The operation of the first operation stage 32 is now described as an example. The 1-bit quantizer 36 generates a bit stream of "+1" or "−1" levels depending on the output of the fourth operation stage 35 to the second multiplier 324. The second multiplier 324 multiplies such output from the 1-bit quantizer 36 by a second coefficient b1. The adder 321 sums the output of the second multiplier 324 and the fractional input value. The accumulator 322 integrates the sum generated from the adder 321. The first multiplier 323 multiplies an output of the accumulator 322 by a first coefficient a1 to generate an output to the adder 311 in the second operation stage 33.

Operation of such similar components in the subsequent operation stages 33, 34, and 35 is similarly performed. The output of the SDM 30 is a bit stream of two levels "+1" and "−1" with an average of such a bit stream being substantially equal to the fractional input value. For example, when a range of the fractional input value is from "0" to "1" and the fractional input value corresponds to "0.5", an average of the bit stream at the output of the SDM 30 has an average value of "0.5".

The operation circuit 31 in FIG. 3 may be implemented with various architectures to perform sigma-delta modulation. For example, the operation circuit 31 may be implemented with the MASH architecture. The accumulator 322 in the first operation stage 32 may be implemented with a closed loop (not shown) of a unit gain amplifier and a delay unit. In addition, the 1-bit quantizer 36 is illustrated by way of example only. Instead of the 1-bit quantizer 36, for example, a 3-bit quantizer may be used in the SDM 30.

Operation in each of the operation stages 32, 33, 34, and 35 is timed according to one same clock signal SDM_CLK in FIG. 3 such that much noise may be generated in the SDM 30.

Figure 4:
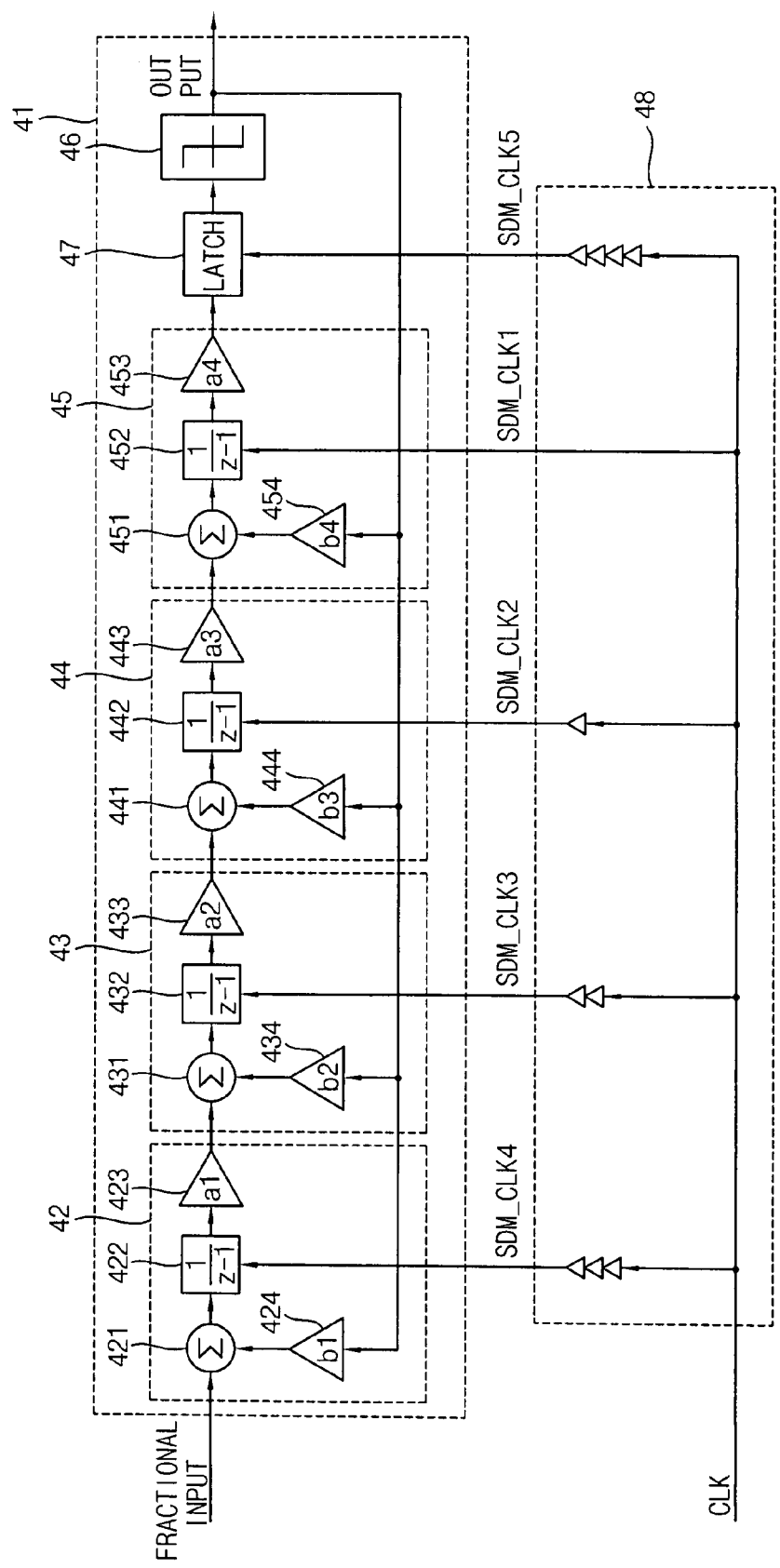
FIG. 4 is a block diagram of a fourth-order sigma-delta modulator (SDM) with reduced noise, according to an example embodiment of the present invention.

FIG. 4 is a block diagram of an SDM (sigma-delta modulator) 40 with reduced noise according to an example embodiment of the present invention. Referring to FIG. 4, the SDM 40 includes an operation circuit 41 and a delay circuit 48. The operation circuit 41 includes first, second, third, and fourth operation stages 42, 43, 44 and 45, respectively, and a 1-bit quantizer 46.

A design of the operation circuit 41 and operation of each of the operation stages 42, 43, 44, 45 and 46 in FIG. 4 are similar to the operation circuit 31 of FIG. 3. Thus, the components 421, 422, 423, 424, 431, 432, 433, 434, 441, 442, 443, 444, 451, 452, 453, 454, and 46 in FIG. 4 are similar to the components 321, 322, 323, 324, 331, 332, 333, 334, 341, 342, 343, 344, 351, 352, 353, 354, and 36, respectively, in FIG. 3.

However, the operation circuit 41 in FIG. 4 further includes a latch 47 coupled between the fourth operation stage 45 and the 1-bit quantizer 46, and the latch 47 stores an output of the fourth operation stage 45. In addition, the first, second, third, and fourth operation stages 42, 43, 44 and 45, respectively, and the latch 47 receive and operate with timing according to different clock signals SDM_CLK4, SDM_CLK3, SDM_CLK2, SDM_CLK1, and SDM_CLK5, respectively.

First, second, third, fourth, and fifth clock signals SDM_CLK1, SDM_CLK2, SDM_CLK3, SDM_CLK4, and SDM_CLK5, respectively, have different delays from the reference clock signal CLK. Such clock signals SDM_CLK1, SDM_CLK2, SDM_CLK3, SDM_CLK4, and SDM_CLK5 are generated with a respective delay from the reference clock signal CLK in the delay circuit 48.

The fourth operation stage 45 operates with timing according to the first clock signal SDM_CLK1 that is not delayed from the reference clock signal CLK. The third operation stage 44 operates with timing according to the second clock signal SDM_CLK2 that is delayed by one unit-time interval from the first clock signal SDM_CLK1. The second operation stage 43 operates with timing according to the third clock signal SDM_CLK3 that is delayed by two unit-time intervals from the first clock signal SDM_CLK1.

In addition, the first operation stage 42 operates with timing according to the fourth clock signal SDM_CLK4 that is delayed for three unit-time intervals from the first clock signal SDM_CLK1. The latch 47 operates with timing according to the fifth clock signal SDM_CLK5 that is delayed for four unit-time intervals from the first clock signal SDM_CLK1. In an example embodiment of the present invention, a maximum delay for the fifth clock signal SDM_CLK5 is shorter than a period of the reference clock signal CLK.

The operation stages 42, 43, 44, and 45, and the latch 47 transfer data to the next stage in synchronization with (such as at an edge on the clock signals SDM_CLK4, SDM_CLK3, SDM_CLK2, SDM_CLK1, and SDM_CLK5, respectively. If an output of a previous stage is transferred to the next stage before an operation of that next stage is completed, an entire transfer function of the SDM 40 may be adversely affected.

For example, an operation of the fourth operation stage 45 at t=n is processed based on an operation result of the third operation stage 44 at t=(n−1). If the output of the third operation stage 44 at t=n is transferred to the fourth operation stage 45 before the operation of the fourth operation stage 45 is completed at t=n, the output of the fourth operation stage 45 at t=n may have a wrong value, and the entire transfer function of the SDM 40 may be changed.

In order to prevent such a situation, the respective clock signal for an operation stage in the series of operations stages 42, 43, 44, and 45 disposed more toward the output of the SDM 40 has less delay. Thus, the first clock signal SDM_CLK1 having no delay from the reference clock signal is used for timing the operation of the respective accumulator 452 of the fourth operation stage 45 that is the last operation stage disposed most toward the output of the SDM 40.

Similarly, the second clock signal SDM_CLK2 with the delay of one unit-time interval is used for timing the operation of the respective accumulator 442 of the third operation stage 44. The third clock signal SDM_CLK3 with the delay of two unit-time intervals is used for timing the operation of the respective accumulator 432 of the second operation stage 43. The fourth clock signal SDM_CLK4 with the delay of three unit-time intervals is used for timing the operation of the respective accumulator 422 of the first operation stage 44. The fifth clock signal SDM_CLK5 with the most delay of four unit-time intervals is used for timing the operation of the latch 47.

Thus, for example, the second operation stage 43 completes an operation to transfer its output to the third operation stage 44. Subsequently, the first operation stage 42 transfers its output to the second operation stage 43. In this manner, the different delays of the clock signals SDM_CLK1, SDM_CLK2, SDM_CLK3, SDM_CLK4, and SDM_CLK5 ensures that the entire transfer function of the SDM 40 is not affected.

Further referring to FIG. 4, the fourth operation stage 45 operates with timing of the first clock signal SDM_CLK1 to generate an output that is stored in the latch 47. Subsequently, the third operation stage 44 operates with timing of the second clock signal SDM_CLK2 to generate an output that is transferred to the adder 451 of the fourth operation stage 45 for the next operation.

In this way, when the first operation stage 42 completes its operation according to timing with the fourth clock signal SDM_CLK4, the output as stored in the latch 47 is transferred to second multipliers 424, 434, 444 and 454 in the operation stages 42, 43, 44 and 45. In this manner, the entire transfer function of the SDM 40 of FIG. 4 remains similar to that of the SDM 30 of FIG. 3 that uses the same one clock signal SDM_CLK.

However, the accumulators 422, 432, 442 and 452 in the SDM 40 of FIG. 4 are timed sequentially with the delayed clock signals SDM_CLK4, SDM_CLK3, SDM_CLK2, and SDM_CLK1 such that noise from the accumulators 422, 432, 442 and 452 are staggered with time. Such dispersed noise from the noise accumulators 422, 432, 442 and 452 are not coupled, and a noise floor of the SDM 40 may be lowered.

The present invention may also be applied to an SDM employing a MASH architecture. In addition, the present invention may be applied to a plurality of digital operation circuits, for example, digital finite/infinite impulse response (FIR/IIR) filters that operate in synchronization with a clock signal and generate switching noise.

Figure 5:
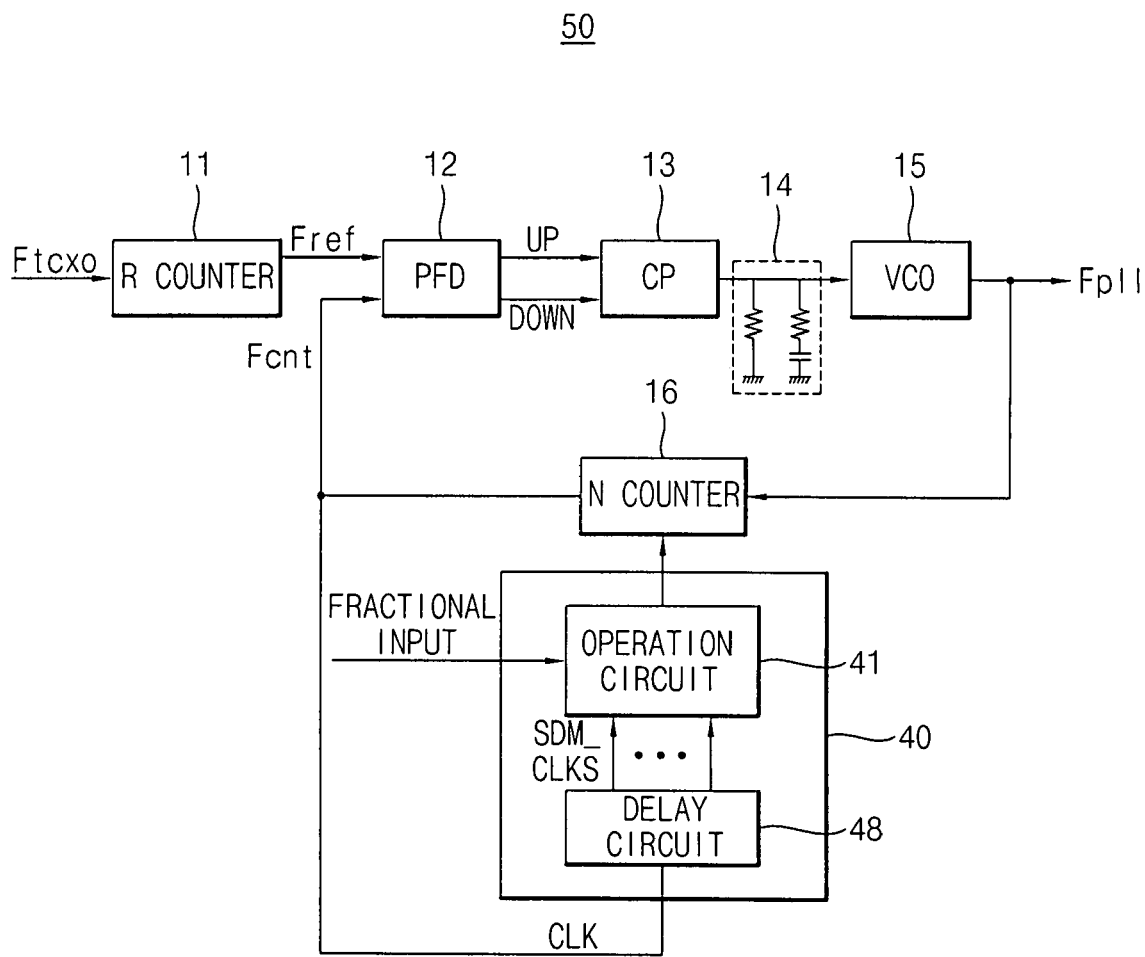
FIG. 5 is a block diagram of a fractional-N PLL including the SDM of FIG. 4, according to an example embodiment of the present invention.

FIG. 5 is a block diagram of a fractional-N phase-locked loop (PLL) incorporating the SDM 40 of FIG. 4, according to an example embodiment of the present invention. Referring to FIG. 5, the PLL 50 includes a reference counter (R counter) 11, a phase-frequency detector (PFD) 12, a charge pump (CP) 13, a loop filter (LF) 14, a voltage-controlled oscillator (VCO) 15, a division counter 16, and the SDM 40. The present invention PLL 50 may also be practiced with a voltage-current converter and a current-controlled oscillator instead of the VCO 15.

The SDM 40 in FIG. 5 includes the operation circuit 41 and the delay circuit 48, similar to FIG. 4. The R counter 11 receives an externally generated oscillation frequency signal Ftcxo and performs frequency division to generate a reference frequency signal Fref. A frequency of the reference frequency signal Fref is equal to 1/R of the frequency of the oscillation frequency signal Ftcxo, with R being a division ratio of the R counter 11.

The PFD 12 compares a phase of the reference frequency signal Fref and a phase of a division frequency signal Fcnt from the N counter 16 to generate compare signals UP and DOWN. The CP 13 charges or discharges the LF 14 in response to the compare signals UP and DOWN. The VCO 15 generates an output frequency signal Fpll of the PLL 50 from a voltage at the LF 14.

The N counter 16 receives the PLL output frequency signal Fpll and performs frequency division to generate the division frequency signal Fcnt. A frequency of the division frequency signal Fcnt is equal to 1/N of the PLL output frequency signal Fpll, with N being a division ratio of the N counter 16.

Such a division ratio of the N counter 16 is adjusted according to an output signal of the SDM 40. For example, when the output signal of the SDM 40 is "0", the N counter 16 operates with the division ratio of N. Alternatively when the output signal of the SDM 40 is "1", the N counter 16 operates with the division ratio of N+1. Additionally, when the N counter 16 is provided with a bit stream from the SDM 40 having an average value of "0.5", the division ratio of the N counter 16 in turn has an average value of N+0.5.

In this manner, the division ratio of the N counter 16 is set by in turn setting the fractional input signal of the SDM 40 to a desired value such that the PLL output signal Fpll has a desired frequency. The division frequency signal Fcnt from the N counter 16 is provided to the PFD 12 and is also provided to the SDM 40 as the clock signal CLK (i.e., the SDM_CLK signal in FIG. 4).

The delay circuit 48 in the SDM 40 of FIG. 5 receives the division frequency signal Fcnt from the N counter 16 as the clock signal CLK (i.e., the SDM_CLK signal in FIG. 4). The delay circuit 48 then generates the multiple clock signals SDM_CLK1, SDM_CLK2, SDM_CLK3, SDM_CLK4, and SDM_CLK5 with the different delays, as described in reference to FIG. 4. The operation circuit 41 and the delay circuit 48 of FIG. 5 operate similarly as described in reference to FIG. 4.

In the conventional fractional-N PLL 10 of FIG. 1, the SDM 17, the PFD 12, and the CP 13 operate concurrently by being timed according to a same clock signal SDM_CLK. In addition, the internal blocks of the SDM 17 concurrently operate in synchronization with the same one clock signal SDM_CLK. Thus, noise is concurrently generated and coupled among such components of the PLL 10 of the prior art.

In contrast in the PLL 50 of the present invention, the operation stages and other components of the SDM 40 are timed according to edges of clock signals that are different from the clock signal for the PFD 12 and the CP 13 in FIG. 5. In addition, the various components of the SDM 40 operate with timing according to such multiple clock signals with different delays. Thus, noise is scattered in time to reduce noise coupling in the PLL 50 of FIG. 5. Therefore, the entire noise of the PLL 50 may be reduced.

Figure 6:
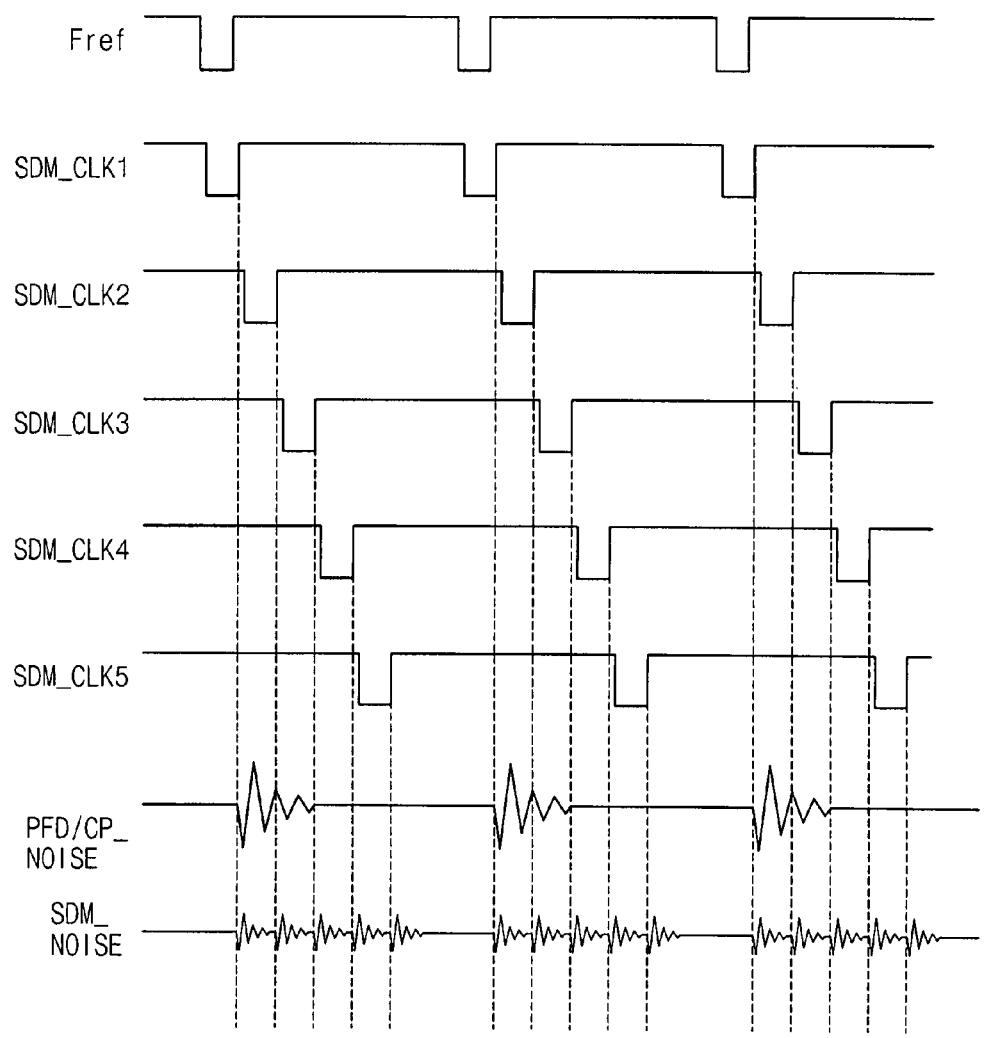
FIG. 6 is a timing diagram illustrating reduced noise in the PLL of FIG. 5.

FIG. 6 is a timing diagram illustrating noise of the PLL 50 in FIG. 5. FIG. 6 shows the reference frequency signal Fref, the multiple clock signals SDM_CLK1, SDM_CLK2, SDM_CLK3, SDM_CLK4, and SDM_CLK5, noise from the PFD 12 and the CP 13 PFD/CP_NOISE, and noise from the SDM 40 SDM_NOISE.

When the reference frequency signal Fref is applied to the PFD 12 and the CP 13 in FIG. 5, the PFD 12 and the CP 13 generate noise PFD/CP_NOISE in synchronization with the reference frequency signal Fref. FIG. 6 illustrates an example with the PLL 50 operating with timing at rising edges of the reference frequency signal Fref. However, the present invention may also be practiced when the PLL 50 operates with timing at falling edges of the reference frequency signal Fref.

The SDM 40 in FIG. 5 operates at rising edges of each of the clock signals SDM_CLK1, SDM_CLK2, SDM_CLK3, SDM_CLK4, and SDM_CLK5 having different delays. Thus, noise is scattered to the rising edges of such multiple clock signals SDM_CLK1, SDM_CLK2, SDM_CLK3, SDM_CLK4, and SDM_CLK5 such that a noise floor and in-band noise of the PLL 50 may be lowered.

Figure 7:
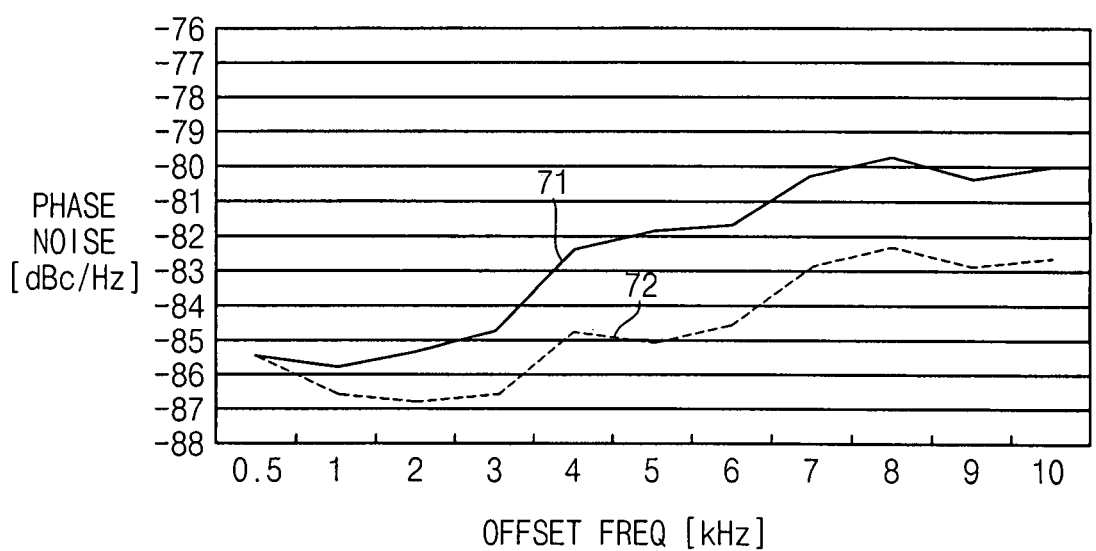
FIG. 7 is a graph comparing respective in-band noise of the PLL in FIG. 1 and the PLL in FIG. 5.

FIG. 7 is a graph illustrating respective in-band noise of the PLL 10 in FIG. 1 which does not include the delay circuit 48 and respective in-band noise of the PLL 50 in FIG. 5 including the delay circuit 48. The vertical axis indicates phase noise expressed in unit of dBc/Hz, and the horizontal axis indicates an offset frequency around an oscillation frequency expressed in units of kHz.

The two PLLs 10 and 50 are operated with a reference frequency Fref of 3.84 MHz, a division ratio of 435.359375, a loop band width of 15 kHz, and an output frequency Fpll of 1,671.78 MHz. Referring to FIG. 7, a first phase noise 71 is generated from the PLL 10 in FIG. 1, and a second phase noise 72 is generated from the PLL 50 in FIG. 5. As illustrated in FIG. 7, the second phase noise 72 is lower by as much as 2 to 3 dBc/Hz than the first phase noise 71.

As described above, the SDM 40 is incorporated into the PLL 50 as an example application of the SDM 40. However, the SDM 40 may also be applied in an analog-digital converter, a digital amplifier, and the like.

While the example embodiments of the present invention and their advantages have been described in detail, it should be understood that various changes, substitutions and alterations may be made herein without departing from the scope of the invention.

The present invention is limited only as defined in the following claims and equivalents thereof.

What is claimed is:
1. A sigma-delta modulator (SDM) comprising:
   a delay circuit that generates a plurality of clock signals, each clock signal having a respective unique delay from a reference clock signal; and
   an operation circuit including a plurality of operation stages that operate with timing according to all of the clock signals for high-order sigma-delta modulations, wherein the operation circuit includes a plurality of first-order sigma-delta modulators coupled in series, and wherein each of the first-order sigma-delta modulators receives a respective unique one of the clock signals.

2. The SDM of claim 1, wherein each of the first-order sigma-delta modulators includes a respective accumulator timed with a respective unique one of the clock signals.

3. The SDM of claim 2, wherein the respective clock signal for a first-order sigma-delta modulator disposed more toward an output of the SDM has less delay.

4. The SDM of claim 3, wherein the respective clock signal for a last first-order sigma-delta modulator is the reference clock signal.

5. The SDM of claim 2, further comprising:
a latch coupled to a last first-order sigma-delta modulator, wherein the latch operates according to one of the clock signals having a maximum delay.

6. The SDM of claim 4, further comprising:
a quantizer that quantizes an output of the latch to generate a quantized output that is fed-back to each of the first-order sigma-delta modulators.

7. The SDM of claim 2, wherein the first-order sigma-delta modulators are each configured with an interpolative architecture.

8. The SDM of claim 1, wherein a maximum delay of the respective delays is smaller than a period of the reference clock signal.

9. A method of performing high-order sigma-delta modulation, comprising:
generating a plurality of clock signals, each clock signal having a respective unique delay from a reference clock signal; and
operating a plurality of operation stages that together perform high-order sigma-delta modulation with timing according to all of the clock signals,
wherein the operation stages include a plurality of first-order sigma-delta modulators coupled in series, and wherein each of the first-order sigma-delta modulators receives a respective unique one of the clock signals.

10. The method of claim 9, wherein each of the first-order sigma-delta modulators includes a respective accumulator timed with a respective unique one of the clock signals.

11. The method of claim 10, wherein the respective clock signal for a first-order sigma-delta modulator disposed more toward an output of the SDM has less delay, and wherein the respective clock signal for a last first-order sigma-delta modulator is the reference clock signal.

12. The method of claim 10, further comprising:
latching an output of a last first-order sigma-delta modulator with timing according to one of the clock signals having a maximum delay; and
quantizing the latched output to generate a quantized output that is fed-back to each of the first-order sigma-delta modulators.

13. A fractional-N phase-locked loop (PLL) comprising:
a phase-frequency detector (PFD) that determines a phase difference between a reference frequency signal and a division frequency signal obtained by frequency division of an output frequency signal of the PLL by a division ratio;
a voltage-controlled oscillator (VCO) that generates the output frequency signal depending on said phase difference; and
a sigma-delta modulator (SDM) for generating the division ratio from a fractional input, the SDM including a plurality of operation stages that operate with timing according to a plurality of clock signals having different delays for high-order sigma-delta modulation,
wherein the operation stages include a plurality of first-order sigma-delta modulators coupled in series, and wherein each of the first-order sigma-delta modulators receives a respective unique one of the clock signals.

14. The fractional-N PLL of claim 13, wherein the SDM further includes:
a delay circuit that generates the plurality of clock signals, each clock signal having a respective unique delay from a reference clock signal.

15. The fractional-N PLL of claim 14, wherein the division frequency signal is the reference clock signal.

16. The fractional-N PLL of claim 15, wherein each of the first-order sigma-delta modulators includes a respective accumulator timed with a respective unique one of the clock signals.

17. The fractional-N PLL of claim 16, wherein the respective clock signal for a first-order sigma-delta modulator disposed more toward an output of the SDM has less delay, and wherein the respective clock signal for a last first-order sigma-delta modulator is the reference clock signal.

18. The fractional-N PLL of claim 16, wherein the SDM further includes:
a latch coupled to a last first-order sigma-delta modulator, wherein the latch operates according to one of the clock signals having a maximum delay; and
a quantizer that quantizes an output of the latch to generate a quantized output that is fed-back to each of the first-order sigma-delta modulators.

19. The fractional-N PLL of claim 16, wherein the first-order sigma-delta modulators are each configured with an interpolative architecture.

20. The fractional-N PLL of claim 14, wherein a maximum delay of the respective delays is smaller than a period of the reference clock signal.

* * * * *